(12) United States Patent
Shiraishi et al.

(10) Patent No.: US 10,551,443 B2
(45) Date of Patent: Feb. 4, 2020

(54) BATTERY DETERIORATION DETERMINATION DEVICE, BATTERY DETERIORATION DETERMINATION METHOD, AND VEHICLE

(71) Applicant: GS Yuasa International Ltd., Kyoto-shi (JP)

(72) Inventors: Takeyuki Shiraishi, Kyoto (JP); Atsushi Fukushima, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 146 days.

(21) Appl. No.: 14/863,283

(22) Filed: Sep. 23, 2015

(65) Prior Publication Data

US 2016/0091573 A1    Mar. 31, 2016

(30) Foreign Application Priority Data

Sep. 30, 2014 (JP) ................................. 2014-199916
Jul. 31, 2015 (JP) ................................. 2015-152351

(51) Int. Cl.
  *G01R 31/36* (2019.01)
  *G01R 31/392* (2019.01)
  *G01R 31/389* (2019.01)

(52) U.S. Cl.
  CPC ......... *G01R 31/392* (2019.01); *G01R 31/389* (2019.01)

(58) Field of Classification Search
  CPC ............ G01R 31/3679; G01R 31/3662; G01R 31/3651; G01R 31/392; G01R 31/389; B60L 11/1838; B60L 11/1851; B60L 11/1861; B60L 11/1862; B60L 2260/58

USPC .......................................... 324/430; 320/109
See application file for complete search history.

(56) References Cited

U.S. PATENT DOCUMENTS

| | | | |
|---|---|---|---|
| 6,218,643 B1* | 4/2001 | Iwata | F01N 3/2013 219/202 |
| RE37,678 E | 4/2002 | Ikawa et al. | |
| RE40,820 E | 7/2009 | Rogers | |
| 2002/0060551 A1* | 5/2002 | Ikeda | B60L 11/1851 320/104 |
| 2006/0186890 A1* | 8/2006 | Iwane | G01R 31/3662 324/426 |
| 2006/0284618 A1 | 12/2006 | Cho et al. | |
| 2007/0001679 A1 | 1/2007 | Cho et al. | |

(Continued)

FOREIGN PATENT DOCUMENTS

| CN | 102175978 A | 9/2011 |
|---|---|---|
| JP | 3752888 B2 | 3/2006 |

(Continued)

*Primary Examiner* — Richard Isla
*Assistant Examiner* — Dung V Bui
(74) *Attorney, Agent, or Firm* — McGinn I.P. Law Group, PLLC.

(57) ABSTRACT

A battery deterioration determination device includes a temperature sensor that detects a temperature of a battery; and a determination unit that determines whether the battery has deteriorated or not, wherein the determination unit executes a different deterioration determination process between a first case where the temperature detected by the temperature sensor is less than a predetermined temperature and a second case where the temperature detected by the temperature sensor is equal to or higher than a predetermined temperature.

22 Claims, 9 Drawing Sheets

(56) References Cited

U.S. PATENT DOCUMENTS

| | | | |
|---|---|---|---|
| 2009/0130538 A1* | 5/2009 | Kaita | G01R 31/3662 429/50 |
| 2010/0117581 A1* | 5/2010 | Miwa | H02P 29/032 318/472 |
| 2011/0213525 A1* | 9/2011 | Kanemoto | F02N 11/0825 701/31.4 |
| 2011/0301891 A1 | 12/2011 | Kim | |
| 2012/0004875 A1 | 1/2012 | Maeda et al. | |
| 2012/0121952 A1 | 5/2012 | Majima et al. | |
| 2012/0256569 A1* | 10/2012 | Kawahara | H01M 10/486 318/139 |
| 2013/0030739 A1* | 1/2013 | Takahashi | G01R 31/3658 702/63 |
| 2014/0218041 A1 | 8/2014 | Cho et al. | |
| 2014/0232302 A1* | 8/2014 | Tsushima | B60L 11/1866 318/139 |

FOREIGN PATENT DOCUMENTS

| | | |
|---|---|---|
| JP | 3941324 B2 | 7/2007 |
| JP | 2008-122165 A | 5/2008 |
| JP | 2008-545962 A | 12/2008 |
| JP | 4449240 B2 | 4/2010 |
| JP | 2010-249770 A | 11/2010 |
| JP | 4763050 B2 | 8/2011 |
| JP | 2011-257372 A | 12/2011 |
| JP | 2012-013554 A | 1/2012 |
| JP | 2012-037337 A | 2/2012 |
| JP | 4946269 B2 | 6/2012 |
| JP | 5004557 B2 | 8/2012 |
| JP | 2013-057576 A | 3/2013 |
| JP | 5320953 B2 | 10/2013 |
| JP | 5368038 B2 | 12/2013 |

\* cited by examiner

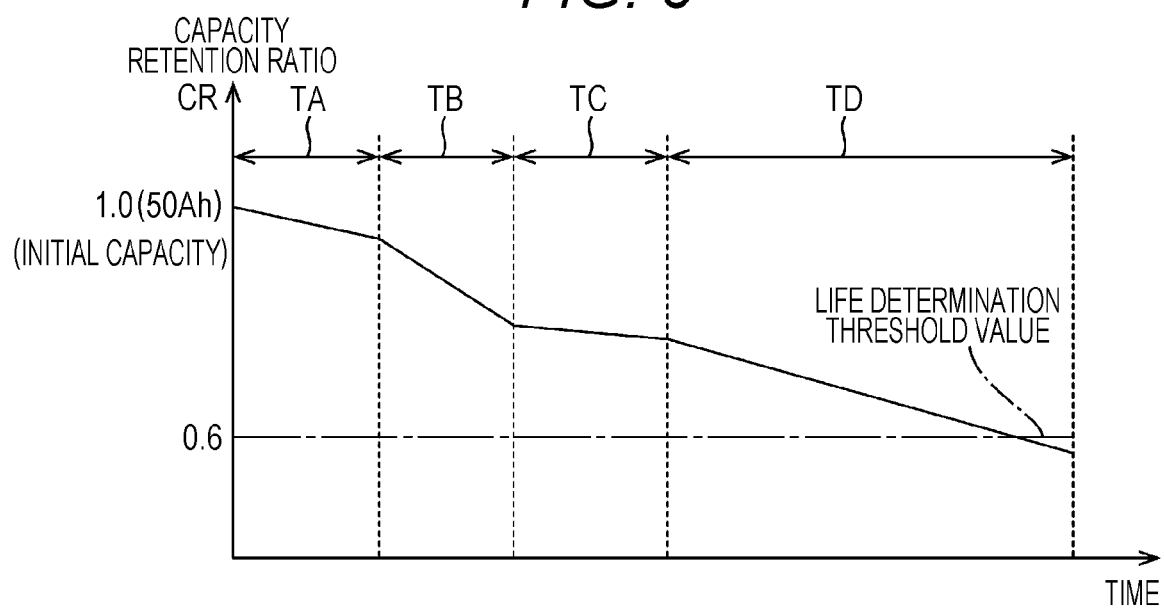

FIG. 9

EQUAL TO OR HIGHER THAN 0°C

|  | BRAND-NEW | ... | LIFE |
|---|---|---|---|
| CAPACITY RETENTION RATIO CR | 100% | ... | 60% |
| SOH | 0 | ... | 100 |

LESS THAN 0°C

|  | BRAND-NEW | ... | LIFE |
|---|---|---|---|
| INTERNAL RESISTANCE VALUE RA | 1mΩ | ... | 1.6mΩ |
| SOH | 0 | ... | 100 |

BATTERY DETERIORATION DETERMINATION DEVICE, BATTERY DETERIORATION DETERMINATION METHOD, AND VEHICLE

CROSS-REFERENCE TO RELATED APPLICATIONS

This application claims the benefit of Japanese patent applications No. 2014-199916, filed on Sep. 30, 2014, and No. 2015-152351, filed on Jul. 31, 2015, which are incorporated by reference.

FIELD

This specification discloses a technique of determining a deterioration of a battery.

BACKGROUND

An engine vehicle, for example, has a battery for a starter motor for starting an engine (internal combustion engine) of this vehicle. A battery deteriorates over time, and is likely to cause start failure of an engine due to deterioration. In view of this, an automobile may include a system which measures a degree of deterioration, and encourages a user to replace the battery, for example, when determining that the deterioration has proceeded to a certain extent. It is known that whether a battery has deteriorated or not can be determined based on an internal resistance of a battery.

For example, JP 2008-122165 A describes a method of detecting a degree of deterioration. In the method, a weight is multiplied to a deterioration degree SOH, which is acquired based on an internal resistance of a battery, to calculate SOH (State Of Health) of the battery. The weight to be multiplied to the internal resistance is set larger, as the battery comes toward the end of its life and the internal resistance increases. With this, the deterioration degree in accordance with the change in the internal resistance depending on the operating time of the battery can be detected.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

An internal resistance of a battery is affected not only by a deterioration degree of the battery but also by an environment where the battery is actually placed. Specifically, most batteries have characteristics such that internal resistances of the batteries are large when an environment temperature is low, and the internal resistances of the batteries are small when the environment temperature is high. That is, in a relatively warm season, an engine may actually be started, even if the deterioration of the battery has proceeded. Therefore, determining deterioration based on the internal resistance using engine startability as an index may not be suitable.

There has been known a method of determining deterioration of a battery based on a capacity retention ratio (not based on an internal resistance of a battery). With this method, an initial capacity is reduced in accordance with an elapsed time or a number of charge-discharge times, and it is determined that the battery comes to the end of its life when the capacity retention ratio is reduced to a predetermined ratio. The capacity retention ratio affects an SOC (State Of Charge) range of a battery, which is used for determining whether an idling stop can be performed or not. Assume that the condition has set such that the SOC range by which the idling stop can be performed is 70% or more. In this case, the idling stop cannot be performed when the battery capacity retention ratio is 70% or less. Therefore, in this case, it can be determined that the battery comes to the end of its life.

A battery has a function of supplying power to a load of a vehicle while the vehicle is parked. When deterioration significantly proceeds, a period in which the vehicle can be parked (for a long time) becomes short. This period can be used as an index for deterioration of the capacity retention ratio.

The capacity retention ratio, which is used for determining battery deterioration, is calculated as to be decreased in accordance with a use history and a temperature history. It is known that cranking performance (engine startability) is greatly affected by an internal resistance of a battery. A voltage drop of a battery is great due to an internal resistance upon an engine start (upon cranking). If only a capacity retention ratio is taken into account (and an internal resistance is not taken into account), a life of a battery may not be properly determined. In addition, the deterioration determination based on a capacity retention ratio does not consider an internal resistance, which is different depending on an environment temperature where a battery is actually placed, at the time of calculating the capacity retention ratio. Therefore, under a low temperature at which an internal resistance is large, a battery might be determined that it has not deteriorated yet because of a high capacity retention ratio, even when the battery should be determined that it has deteriorated. Specifically, in winter season, for example, a battery is placed in a low temperature environment. The battery might be determined it has not deteriorated yet because of a high capacity retention ratio even when the battery should be determined it has deteriorated due to a large internal resistance caused by low environment temperature. In such a case, the battery is not replaced, resulting in an engine start failure.

As described above, both in the case in which a deterioration degree of a battery is determined based on an internal resistance of the battery and in the case in which the deterioration degree of the battery is determined based on a capacity retention ratio of the battery, the battery life might not properly be determined.

The present invention aims to properly determine a battery life.

A battery deterioration determination device according to an aspect of the present invention disclosed in this specification includes a temperature detection unit configured to detect a temperature of a battery; and a determination unit configured to determine whether the battery has deteriorated or not, wherein the determination unit executes a different deterioration determination process between a first case where the temperature detected by the temperature detection unit is less than a predetermined temperature and a second case where the temperature detected by the temperature detection unit is equal to or higher than a predetermined temperature.

BRIEF DESCRIPTION OF DRAWINGS

The foregoing and other features of the present invention will become apparent from the following description and drawings of an illustrative embodiment of the invention in which:

FIG. 6 is a diagram illustrating a decrease in a capacity retention ratio over time.

FIG. 7 is a diagram illustrating a subtracted value of capacity according to a battery temperature and a charge-discharge integration amount.

FIG. 9 is a diagram illustrating SOH according to deterioration determination methods which are different depending upon a temperature.

Figure 1:
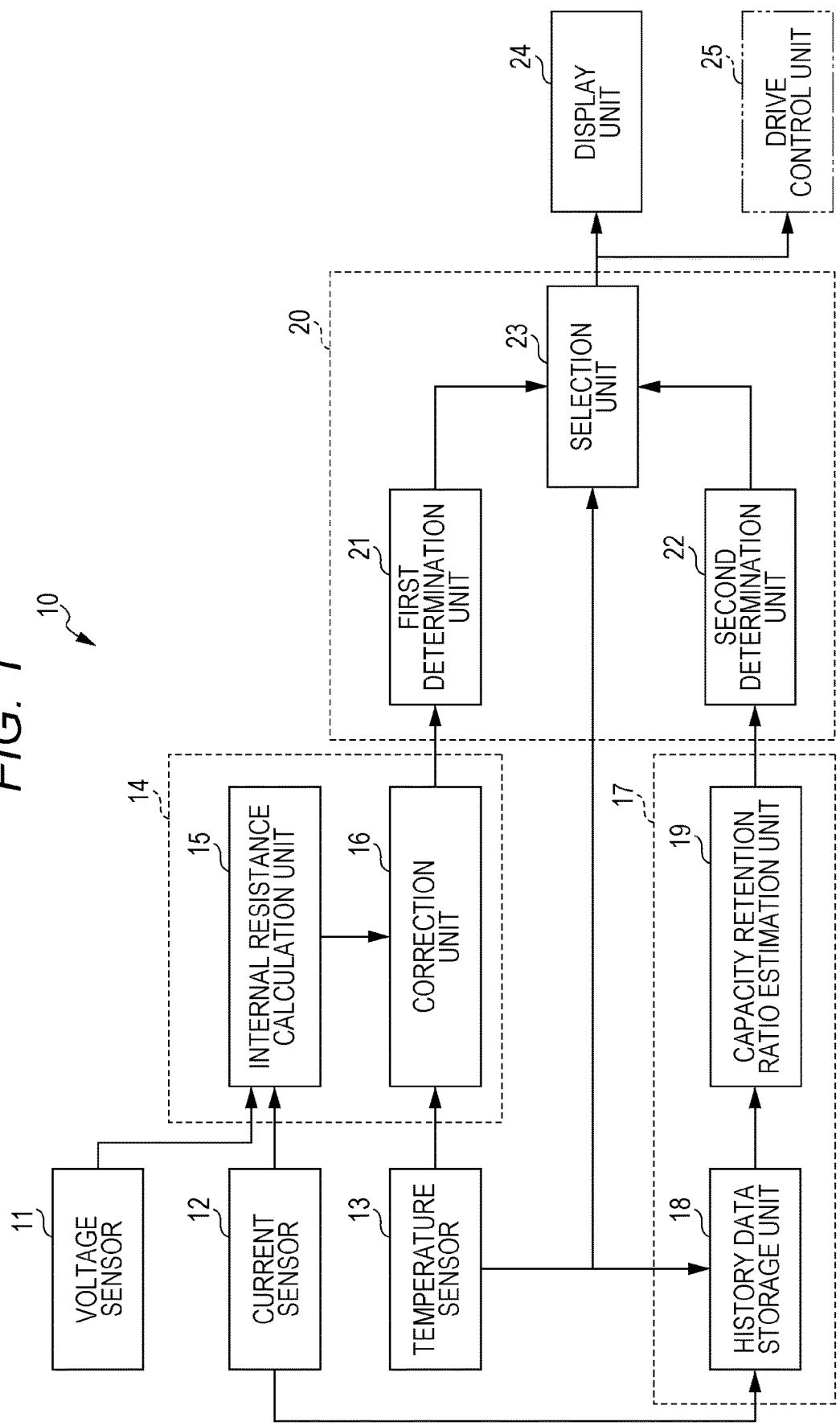
FIG. 1 is a block diagram illustrating a configuration of a deterioration determination device according to a first embodiment.

DESCRIPTION OF EMBODIMENTS (Outline of Present Embodiment)

Firstly, an outline of the present embodiment will be described.

A battery deterioration determination device according to an aspect of the present invention includes a temperature detection unit configured to detect a temperature of a battery; and a determination unit configured to determine whether a battery has deteriorated or not, wherein the determination unit executes a different deterioration determination process between a first case where the temperature detected by the temperature detection unit is less than a predetermined temperature and a second case where the temperature detected by the temperature detection unit is equal to or higher than a predetermined temperature.

A battery deterioration determination method according to an aspect of the present invention includes: executing a different deterioration determination process between a first case where a battery temperature is less than a predetermined temperature and a second case where a battery temperature is equal to or higher than a predetermined temperature.

A vehicle according to an aspect of the present invention includes a temperature detection unit configured to detect a temperature of a battery; and a determination unit configured to determine whether the battery has deteriorated or not, wherein the determination unit executes a different deterioration determination process between a first case where the temperature detected by the temperature detection unit is less than a predetermined temperature and a second case where the temperature detected by the temperature detection unit is equal to or higher than a predetermined temperature.

The battery deterioration determination device disclosed in the present specification can properly determine a battery life.

With the above configuration in which a different deterioration determination process is executed between the first case where the temperature of the battery detected by the temperature detection unit is less than a predetermined temperature and the second case in which the temperature of the battery detected by the temperature detection unit is equal to or higher than a predetermined temperature, appropriate deterioration determination according to an environment temperature can be performed, compared to the case where the same deterioration determination process is performed for all temperatures. Accordingly, a battery life can properly be determined.

According to an aspect of the present invention, the battery deterioration determination device may include an internal resistance detection unit configured to detect an internal resistance of the battery; and a capacity retention ratio calculation unit configured to calculate a capacity retention ratio that is a capacity ratio relative to an initial capacity of the battery, wherein the determination unit may execute, as the deterioration determination process, at least one of a first determination process and a second determination process, the first determination process for performing the determination based on an internal resistance detected by the internal resistance detection unit, when the temperature detected by the temperature detection unit is less than a predetermined temperature, and the second determination process for performing the determination based on a capacity retention ratio calculated by the capacity retention ratio calculation unit, when the temperature detected by the temperature detection unit is equal to or higher than a predetermined temperature.

With the above configuration, when the temperature of the battery is less than the predetermined temperature, battery deterioration (e.g., deterioration by which a starting failure of an engine is likely to occur) is determined based on an internal resistance which becomes larger when the temperature of the battery upon the measurement is low. Accordingly, whether the battery has deteriorated or not at the time when the environment temperature is low can properly be determined. On the other hand, when the temperature of the battery is equal to or higher than the predetermined temperature, the deterioration of the battery is determined based on a capacity retention ratio of the battery. This can prevent the situation in which the battery is determined not deteriorated yet because the environment temperature is high and the internal resistance is small, though the capacity retention ratio is low. The capacity retention ratio affects an SOC range of a battery, which is used for determining whether an idling stop can be performed or not. Therefore, in a vehicle having an idling stop function, the life of the battery can be determined depending on whether the idling stop can be performed or not. A battery has a function of supplying power to a load of a vehicle while the vehicle is parked. When deterioration proceeds, a period in which the vehicle can be parked (for a long time) becomes short. Accordingly, the period in which the vehicle can be parked can be used as an index for the deterioration determination based on the capacity retention ratio.

According to an aspect of the present invention, the determination unit may execute the first determination process when the temperature detected by the temperature detection unit is less than the predetermined temperature, and execute the second determination process when the temperature detected by the temperature detection unit is equal to or higher than the predetermined temperature.

With this configuration, a battery life can properly be determined in both the case where an environment temperature is low and the case where an environment temperature is high.

According to an aspect of the present invention, the determination unit may determine whether the battery has deteriorated or not based on a value obtained by correcting an internal resistance detected by the internal resistance detection unit to an internal resistance at a reference temperature that is lower than the temperature upon the detection of the internal resistance.

With this configuration, whether the battery has deteriorated or not can be determined based on an internal resistance at a reference temperature lower than the temperature upon the detection, whereby the battery life can be determined at a safety side when an environment temperature is low.

According to an aspect of the present invention, the determination unit may perform a process of determining whether the battery has deteriorated or not based on the internal resistance and the capacity retention ratio, when the temperature detected by the temperature detection unit is less than the predetermined temperature.

With this configuration, the deterioration determination is performed based on a capacity retention ratio as well as an internal resistance, when the detected temperature is less than the predetermined temperature. Therefore, if the battery is not determined to be deteriorated based on an internal resistance upon a low temperature, the deterioration determination can be performed based on a capacity retention ratio. Accordingly, precision of the deterioration determination can be enhanced.

According to an aspect of the present invention, the capacity retention ratio may be calculated based on a temperature and a charge-discharge history.

According to an aspect of the present invention, the determination unit may determine that the battery has deteriorated when the internal resistance or the capacity retention ratio reaches a predetermined life end value specifying a life, and notify the need to replace the battery.

With this configuration, a battery can be replaced when it comes to the end of its life.

According to an aspect of the present invention, the determination unit may execute both the first determination process and the second determination process within a predetermined temperature range, and determine whether the battery has deteriorated or not by weighting the internal resistance and the capacity retention ratio within the predetermined temperature range.

With this configuration, deterioration determination of a battery can properly be performed in the case where the determination as to whether the battery has deteriorated or not cannot appropriately be performed only based on an internal resistance or a capacity retention ratio within a predetermined temperature range.

According to an aspect of the present invention, in the battery deterioration determination device which is mounted to a vehicle having an internal combustion engine started by a starter motor and determines whether a battery supplying power for driving the starter motor has deteriorated or not, wherein the internal resistance detection unit can detect the internal resistance by calculating detection results outputted from a voltage detection unit and a current detection unit, which detect a voltage and a current upon driving the starter motor, respectively.

With this configuration, an internal resistance is detected based on the detection results of a voltage and a current upon driving the starter motor. Therefore, deterioration of a battery by which starting failure of the engine is likely to occur can be detected.

According to an aspect of the present invention, the internal resistance may be calculated based on a voltage and a current only when the temperature of the battery upon an engine start is less than the predetermined temperature.

With the configuration in which the internal resistance is calculated based on a voltage and a current only when the temperature is less than the predetermined temperature, a correction equation for correcting the internal resistance based on a temperature can be simplified. Therefore, enhancement in precision can be expected.

According to an aspect of the present invention, the internal resistance detection unit may determine whether the battery has deteriorated or not based on the internal resistance when the temperature of the battery upon an engine start or an engine stop is less than the predetermined temperature, even if the temperature of the battery becomes equal to or higher than the predetermined temperature.

This configuration can enhance precision in determining whether the battery has deteriorated or not under a condition in which an ambient environment temperature is low.

According to an aspect of the present invention, the determination unit may determine whether the battery has deteriorated or not by adding a numerical value according to a use state of the battery to the last detected internal resistance value, when the temperature becomes less than the predetermined temperature from the temperature equal to or higher than the predetermined temperature.

This configuration can enhance precision in determining whether the battery has deteriorated or not after the vehicle is started and before an engine start (before cranking).

According to an aspect of the present invention, the battery deterioration determination device may execute an idling stop execution determination for determining whether or not an idling stop is executed or an idling stop time determination for calculating the idling stop time according to the determination of the determination unit.

With this configuration, power shortage of the battery upon an idling can be avoided.

According to an aspect of the present invention, regenerative power may be inputted to the battery, and the determination unit may determine a condition for receiving regenerative power according to deterioration of the battery.

This configuration can regulate the reception of regenerative power upon deterioration of the battery.

According to an aspect of the present invention, the determination unit may determine whether the battery is to be replaced or not according to deterioration of the battery.

With this configuration, a time for replacement of the battery can be recognized.

According to an aspect of the present invention, the determination unit may determine whether a charge-discharge control has to be changed or not according to deterioration of the battery.

This configuration can suppress charge-discharge to the battery when the battery has deteriorated.

According to an aspect of the present invention, the capacity retention ratio calculation unit can calculate the capacity retention ratio by calculating a ratio of an initial capacity of the battery to a capacity obtained by subtracting a value according to a temperature of the battery and a charge-discharge integration amount of the battery from the initial capacity of the battery.

According to an aspect of the present invention, the predetermined temperature may be 0° C., and the determination unit may switch the deterioration determination process between the case in which the temperature detected by the temperature detection unit is less than 0° C. and the case in which the temperature detected by the temperature detection unit is equal to or higher than 020 C.

With this configuration, the deterioration determination process can be switched with 0° C., at which the influence of an internal resistance becomes relatively large, as a reference.

According to an aspect of the present invention, the battery may be a lithium ion storage battery.

A lithium ion storage battery can be formed to have a large effective area of an electrode plate and small internal resistance of components. Therefore, the configuration described above can suppress an influence caused by heat generation due to an internal resistance of the battery to a detected temperature, compared to other batteries (lead-acid batteries, nickel cadmium storage batteries, and nickel hydrogen storage batteries).

According to an aspect of the present invention, the battery may be a battery for starting an engine.

According to an aspect of the present invention, the battery may be mounted to a four-wheel vehicle.

<First Embodiment>

A first embodiment of the present invention will be described with reference to FIGS. 1 to 10.

1. Configuration of Deterioration Determination Device

A deterioration determination device 10 is a device for determining whether an assembled battery (not illustrated) has deteriorated or not. The deterioration determination device 10 is provided in a battery management system, for example, and mounted to a vehicle such as an automobile. This automobile has an internal combustion engine started by a starter motor, and has an idling stop function. The assembled battery has a structure in which a plurality of battery cells is connected in series, and each battery cell is a rechargeable secondary battery. The assembled battery can be a lithium ion storage battery, for example.

As illustrated in FIG. 1, the deterioration determination device 10 includes a voltage sensor 11 (one example of a "voltage detection unit"), a current sensor 12 (one example of a "current detection unit"), a temperature sensor 13 (one example of a "temperature detection unit"), an internal resistance detection unit 14, a capacity retention ratio calculation unit 17, a determination unit 20, and a display unit 24.

The voltage sensor 11 can detect a voltage of the entire assembled battery, and outputs a detection signal according to voltages at both ends of the assembled battery. The current sensor 12 outputs a detection signal according to a current value of a charge current or a discharge current (hereinafter referred to as charge-discharge current) flowing through the assembled battery. The temperature sensor 13 outputs a detection signal according to a temperature of the assembled battery in a contact or a non-contact manner. The temperature sensor 13 is mounted to each battery cell, and outputs a detection signal according to the temperature of the corresponding battery cell.

The internal resistance detection unit 14 detects an internal resistance of the assembled battery based on the detection results of the voltage sensor 11, the current sensor 12, and the temperature sensor 13, and includes an internal resistance calculation unit 15 and a correction unit 16. The internal resistance calculation unit 15 receives a voltage detection signal and a current detection signal from the voltage sensor 11 and the current sensor 12, respectively. The internal resistance calculation unit 15 obtains a voltage change $\Delta V$ and a current change $\Delta I$ upon cranking, for example, and calculates an internal resistance R from $\Delta V/\Delta I=R$.

Figure 2:
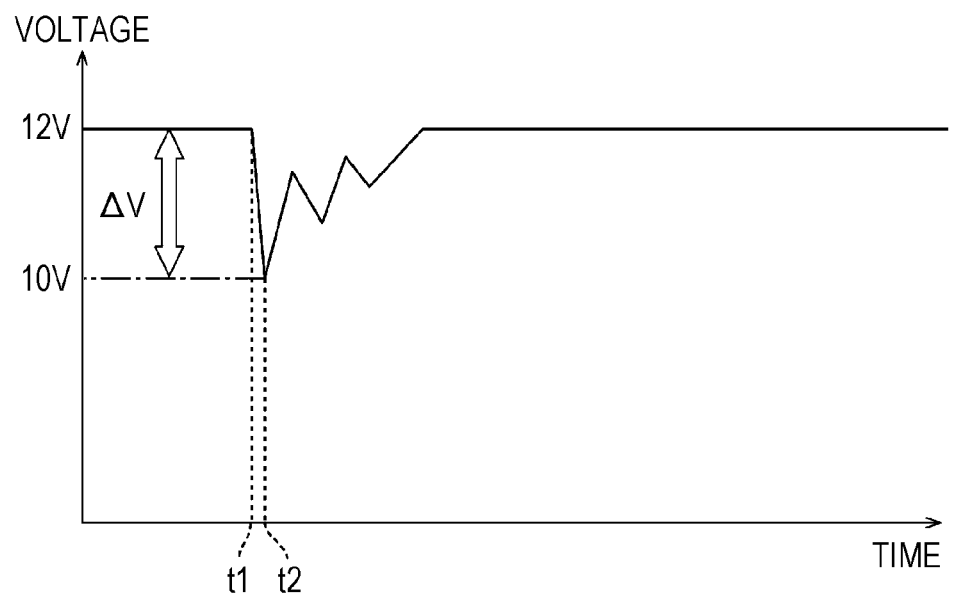
FIG. 2 is a diagram illustrating that a voltage of a battery changes with time upon cranking.
Figure 3:
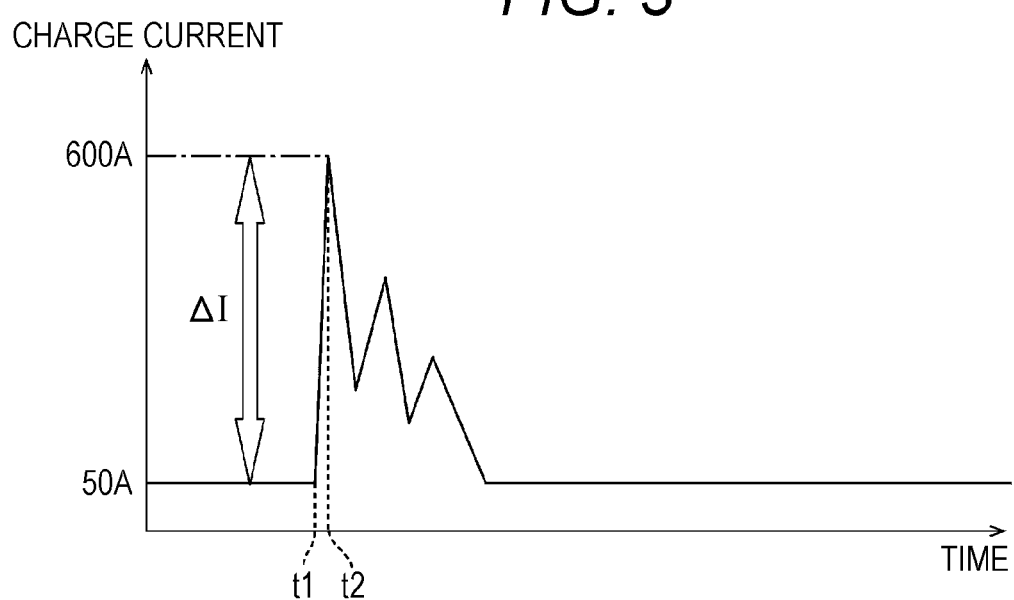
FIG. 3 is a diagram illustrating that a current of a battery changes with time upon cranking.

For example, as illustrated in FIGS. 2 and 3, when cranking is performed during a period from times t1 to t2, and the voltage change $\Delta V$ and the current change $\Delta I$ illustrated in these figures occur at this time, the internal resistance R at this time can be obtained as:

$$R=(|12[V]-10[V]|)/(|50[A]-600[A]|)=3.63[m\Omega]$$

Figure 4:
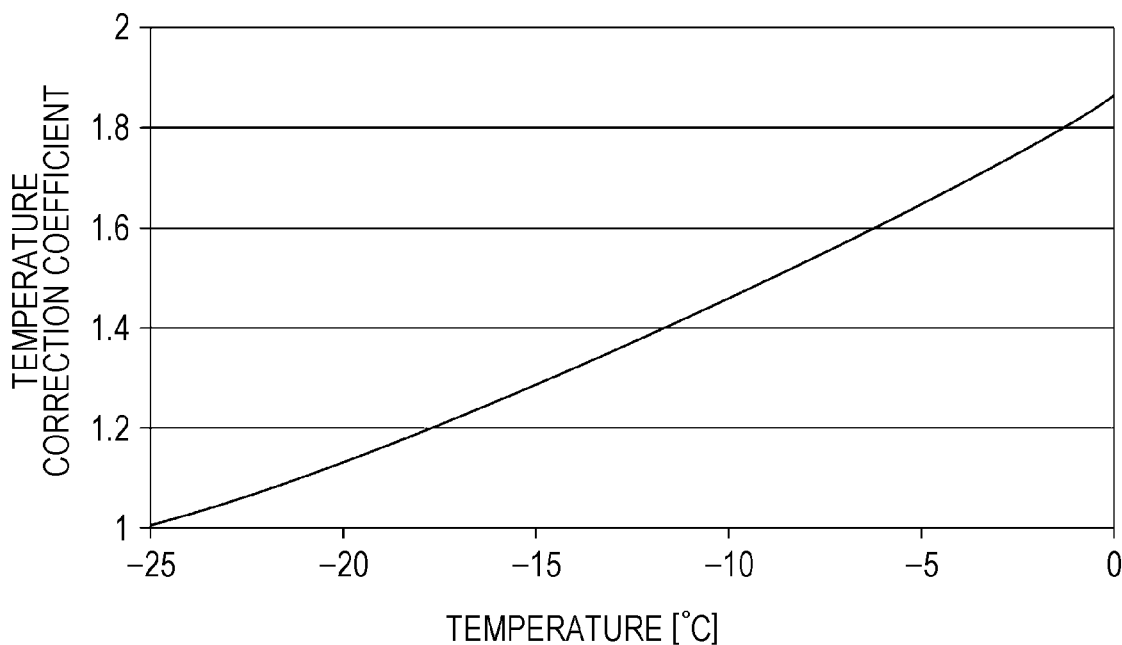
FIG. 4 is a diagram illustrating a relationship between a temperature and a temperature correction coefficient.

The correction unit 16 receives a detection signal from the temperature sensor 13 and an output from the internal resistance calculation unit 15, and converts the internal resistance R into an internal resistance RA at a reference temperature (in the present embodiment, −25° C.) lower than the temperature upon the detection of the internal resistance R. Specifically, the relationship between a temperature and a temperature correction coefficient illustrated in the graph of FIG. 4 is experimentally determined as a function of a temperature correction coefficient with a temperature defined as a variable, and this function is stored in a storage device not illustrated. When the temperature of the battery at present is measured based on the signal from the temperature sensor 13, this temperature is inputted to the above function to obtain the temperature correction coefficient. This temperature correction coefficient is multiplied to the internal resistance R calculated from the above equation to correct the internal resistance R to the internal resistance RA converted into a reference temperature that is the expected lower limit temperature.

Figure 5:
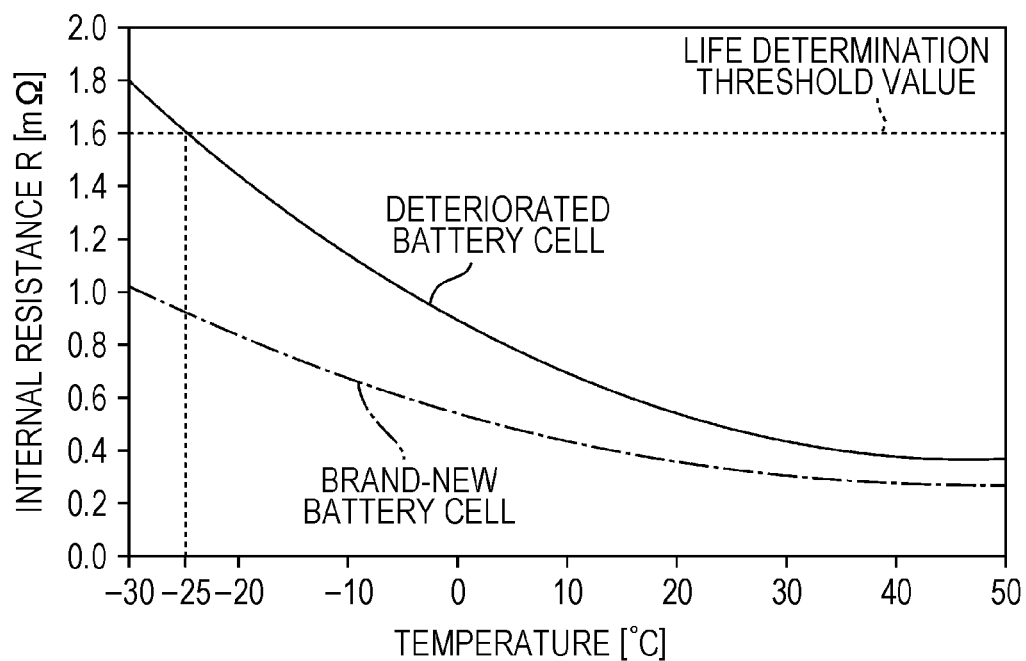
FIG. 5 is a diagram illustrating that an internal resistance of a battery changes according to a temperature.

An internal resistance of a battery generally changes with the relationship illustrated in FIG. 5 according to a temperature of the battery. The resistance change curve according to a temperature is shifted to a higher internal resistance, as deterioration of the battery proceeds. Even if a brand-new battery has a resistance change curve indicated by a broken line in FIG. 5, the resistance change curve becomes the one indicated by a solid line in FIG. 5, if this battery deteriorates. In view of this, in the present embodiment, the reference temperature is determined as −25° C. When the internal resistance RA at the reference temperature exceeds a life determination threshold value (predetermined value, e.g., 1.6 m$\Omega$), it is determined that the battery has deteriorated to an extent in which the battery needs to be replaced.

As illustrated in FIG. 1, the capacity retention ratio calculation unit 17 includes a history data storage unit 18 and a capacity retention ratio estimation unit 19. The history data storage unit 18 receives the detection signals from the current sensor 12 and the temperature sensor 13, thereby storing a charge-discharge current value at that point and a temperature of the battery at that point for every predetermined sampling time.

The capacity retention ratio estimation unit 19 reads history data stored in the history data storage unit 18, and calculates the current capacity retention ratio CR based on the read history data. The capacity retention ratio CR is a ratio (percentage) between an initial capacity of a brand-new battery in a full charged state and a capacity that the battery would later have in a full charged state. Generally, a battery deteriorates according to a temperature history and a charge-discharge history under a usage environment, and the battery further deteriorates, as it is placed under a higher temperature environment or as a large charge-discharge current flows through the battery. In view of this, if a history indicating how much charge-discharge current flows at what temperature is recognized, and the value according to this history is subtracted from an initial capacity, the full charge capacity at that time can be calculated, based on which a capacity retention ratio can be calculated.

A subtracted value according to a temperature history and a charge-discharge history is obtained from data acquired beforehand from battery experiments. FIG. 7 illustrates a relationship between a temperature at which a battery is placed and a subtracted capacity per an hour and a relationship between a charge-discharge integration amount and a subtracted capacity. FIG. 6 illustrates the case in which a battery temperature is 25° C. and a charge-discharge integration amount is 10000 Ah in a period TA, a battery temperature is 60° C. and a charge-discharge integration amount is 5000 Ah in a period TB, a battery temperature is 0° C. and a charge-discharge integration amount is 2000 Ah in a period TC, and a battery temperature is 25° C. and a charge-discharge integration amount is 50000 Ah in a period TD. As described above, a capacity according to a battery temperature and a charge-discharge integration amount is subtracted from an initial capacity, whereby the capacity of the battery, which gradually deteriorates from its brand-new state, in a full charged state is obtained, and based on this capacity, a capacity retention ratio can be obtained.

Figure 8:
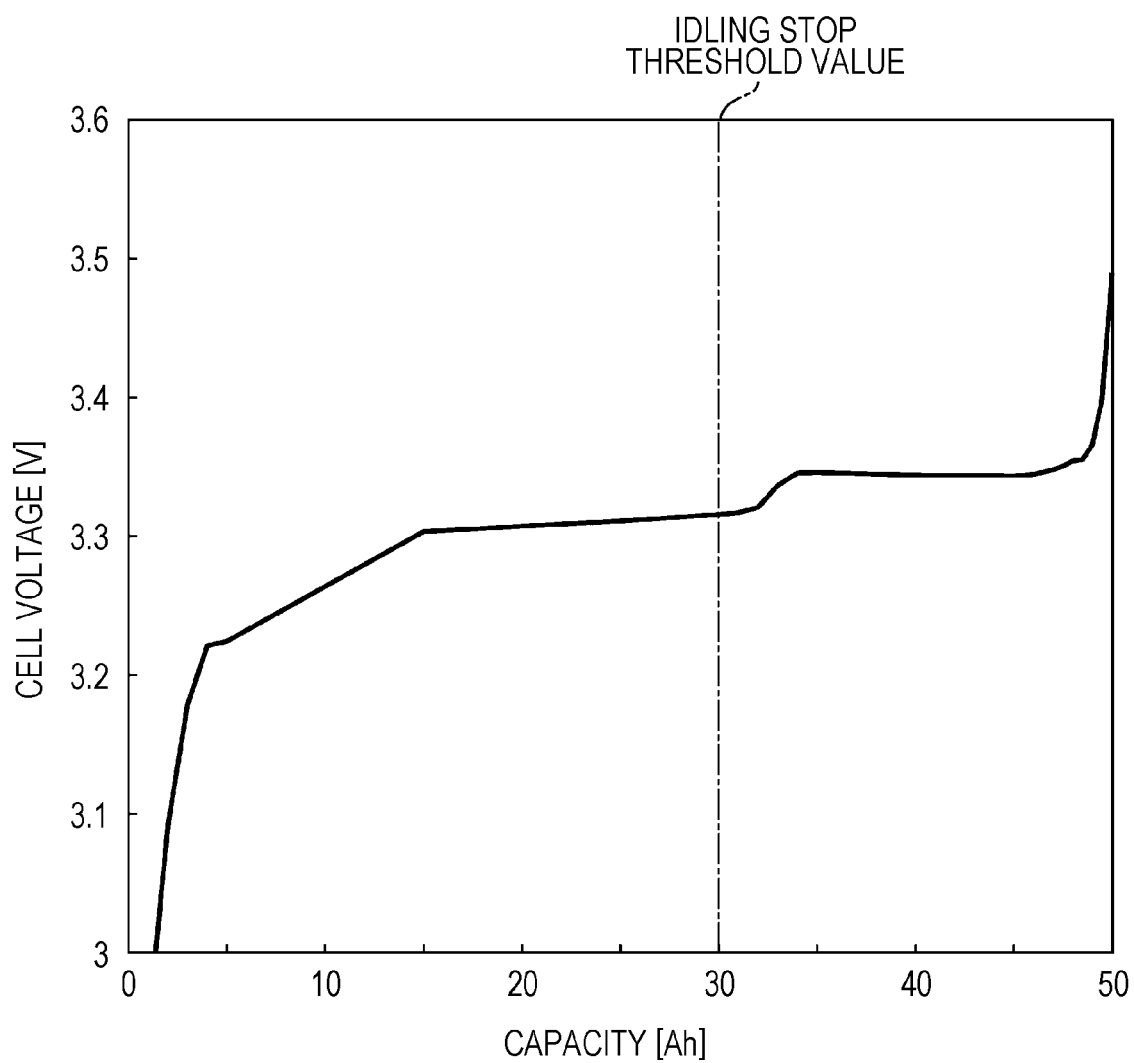
FIG. 8 is a diagram illustrating a relationship between a capacity and a voltage of a battery.

In the present embodiment, when the capacity retention ratio is decreased to 0.6 (60%), it is determined that deterioration proceeds, and a display for encouraging a user to replace the battery is made. As illustrated in FIG. 8, when the current capacity retention ratio CR reaches an idling stop threshold value (predetermined value, e.g., 60% in the present embodiment), idling stop is not performed.

As illustrated in FIG. 1, the determination unit 20 includes a first determination unit 21, a second determination unit 22, and a selection unit 23. The first determination unit 21 determines whether or not the internal resistance RA received from the correction unit 16 is equal to or larger than a life determination threshold value for determining the end of life of the battery. When the internal resistance RA is equal to or larger than the life determination threshold value (1.6 mΩ), the first determination unit 21 outputs information (e.g., it may be information indicating that the battery comes to the end of its life) about deterioration of the battery to the selection unit 23.

The second determination unit 22 determines whether or not the capacity retention ratio CR received from the capacity retention ratio estimation unit 19 is equal to or smaller than the capacity retention ratio CR (60%) by which the battery is determined to come to the end of its life. The second determination unit 22 outputs information about deterioration of the battery to the selection unit 23, when the capacity retention ratio CR is equal to or lower than a predetermined ratio.

The selection unit 23 selects information (it may be information indicating that the battery comes to the end of its life) about a degree of deterioration of the battery inputted from the first determination unit 21, and outputs this information to the display unit 24, when the temperature detected by the temperature sensor 13 is less than a predetermined temperature (in the present embodiment, 0° C.). On the other hand, the selection unit 23 selects information (e.g., information indicating that the battery comes to the end of its life) about a degree of deterioration of the battery inputted from the second determination unit 22, and outputs this information to the display unit 24, when the temperature detected by the temperature sensor 13 is equal to or higher than the predetermined temperature (in the present embodiment, 0° C.). Accordingly, the process by the first determination unit 21 and the selection unit 23 is one example of a "first determination process", and the process by the second determination unit 22 and the selection unit 23 is one example of a "second determination process". The selection unit 23 switches the first determination process and the second determination process. In FIG. 9, the relationship between a capacity retention ratio CR and an SOH (State Of Health) of a battery and a relationship between an internal resistance RA and an SOH of a battery in a brand-new state and in a state in which the battery comes to the end of its life (in a deteriorated state) are linearly changed. The SOH of the battery can be determined from these numerical values.

The display unit 24 includes a liquid crystal display, and can display a deterioration state (SOH) of an assembled battery. When receiving information (it may be information indicating that the battery comes to the end of its life) about a deterioration degree of the battery from the determination unit 20, the display unit 24 displays information for encouraging a user to replace the battery. The display unit 24 includes an operation unit receiving an input from a user.

It is to be noted that an output from the determination unit 20 is outputted to a drive control unit 25 (this unit may be provided at the inside or outside of the deterioration determination device 10) for controlling an engine drive. When receiving information indicating that the battery comes to the end of its life from the determination unit 20, the drive control unit 25 does not perform idling stop (the drive control unit 25 keeps an idling state), even when the vehicle stops.

The processes of the internal resistance detection unit 14, the capacity retention ratio calculation unit 17, and the determination unit 20 are executed by a central processing unit (hereinafter referred to as a CPU). The CPU includes a storage unit, such as a ROM and a RAM, which stores various programs (including a battery management program) for controlling an operation of the battery management system (BMS).

The process performed by the deterioration determination device 10 will be described.

Figure 10:
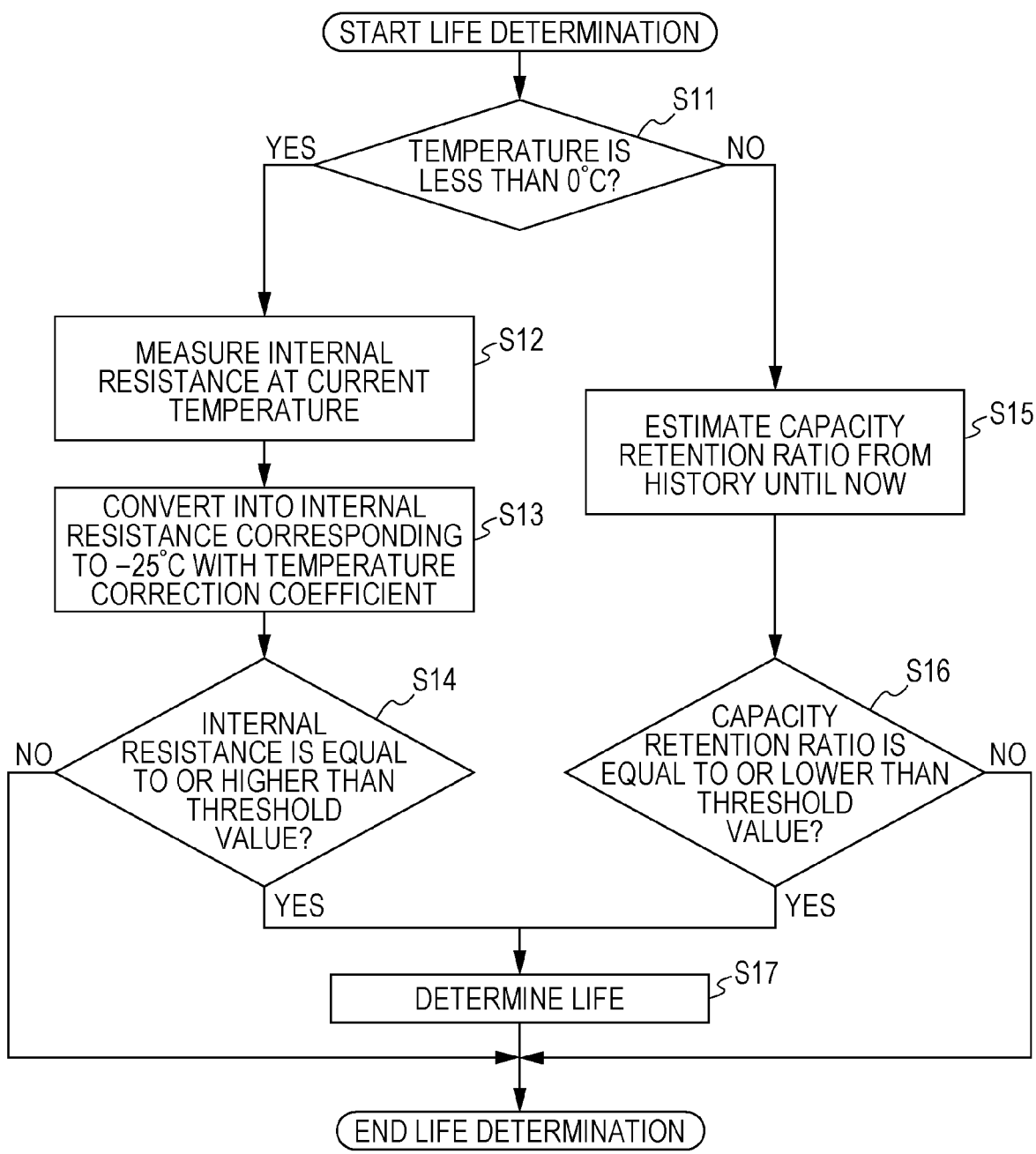
FIG. 10 is a flowchart illustrating a deterioration determination process.

The CPU receives detection signals from the voltage sensor 11, the current sensor 12, and the temperature sensor 13, and determines whether or not the temperature detected by the temperature sensor 13 is less than 0° C. (S11) as illustrated in FIG. 10. When the temperature detected by the temperature sensor 13 upon the last cranking is less than 0° C. ("YES" in S11), the internal resistance R at the current temperature is measured based on the voltage change and the current change detected by the voltage sensor 11 and the current sensor 12 (S12). A temperature correction coefficient is multiplied to the internal resistance R obtained by the internal resistance calculation unit at the correction unit 16, whereby the internal resistance R is converted into an internal resistance RA corresponding to the temperature of −25° C. (S13).

Next, the CPU determines whether or not the internal resistance RA at −25° C. is equal to or higher than the life determination threshold value (S14). When the internal resistance RA at −25° C. is equal to or higher than the life determination threshold value ("YES" in S14), the CPU determines that the battery comes to the end of its life (S17), and displays information encouraging the user to replace the battery on the display unit 24. Then, the CPU ends the life determination. When the internal resistance RA at −25° C. is less than the life determination threshold value ("NO" in S14), the battery does not yet come to the end of its life. Therefore, the CPU ends the life determination without determining that the battery comes to the end of its life.

On the other hand, when the temperature detected by the temperature sensor 13 is equal to or higher than 0° C. ("NO" in S11), the CPU reads the history until now from the history data storage unit 18, and subtracts a value according to a temperature or a charge-discharge current to estimate a capacity retention ratio CR (S15). The CPU determines whether or not this capacity retention ratio CR is equal to or lower than a threshold value (S16). When the capacity retention ratio CR is equal to or lower than the threshold value ("YES" in S16), the CPU determines that the battery comes to the end of its life (S17), and displays information encouraging the user to replace the battery on the display unit 24. Then, the CPU ends the life determination. On the other hand, when the capacity retention ratio CR is larger than the life determination threshold value ("NO" in S16), the battery does not yet come to the end of its life. Therefore, the CPU ends the life determination without determining that the battery comes to the end of its life.

According to the above embodiment, when the temperature of the battery is less than a predetermined temperature (e.g., 0° C.), whether the battery has deteriorated or not is determined based on the internal resistance R. Therefore, when the battery deterioration proceeds, and further, cranking is nearly difficult due to low battery temperature, a warning for encouraging the user to replace the battery can be issued beforehand. Specifically, in the case where the deterioration determination is always performed according to a method based on a capacity retention ratio, a situation described below might occur. Specifically, in winter, a battery cannot be determined to deteriorate from the viewpoint of the calculated capacity retention ratio. However, the internal resistance of the battery is actually high, because the environment temperature is less than 0° C., and therefore, cranking cannot appropriately be performed. The present embodiment can prevent such situation from occurring.

On the other hand, when the temperature of the battery is equal to or higher than the predetermined temperature (e.g., 0° C.), whether the battery has deteriorated or not is determined based on the capacity retention ratio CR of the battery. Therefore, when it is determined that the deterioration proceeds from the viewpoint of the capacity retention ratio, a warning for encouraging the user to replace the battery can be issued. Specifically, if the deterioration determination is always performed based on the internal resistance R, the situation described below might occur. That is, at daytime with relatively high ambient temperature, the battery temperature is high, and the internal resistance is low, so that it is determined that deterioration does not proceed. However, next morning, the battery temperature greatly reduces, and the cranking might become difficult. The battery deterioration determination device according to the present embodiment can prevent such situation from occurring.

The determination unit 20 determines whether the battery has deteriorated or not based on a value obtained by correcting the internal resistance R detected by the internal resistance detection unit 14 to an internal resistance RA at a reference temperature (e.g., −25° C.) that is lower than the temperature upon the detection of the internal resistance R.

With this configuration, whether the battery has deteriorated or not can be determined based on the internal resistance RA at the reference temperature lower than the temperature upon the detection. Therefore, the deterioration determination can always be performed at a safety side, and the battery life can properly be determined even in consideration of the situation in which the battery environment temperature rapidly lowers.

<Second Embodiment>

Figure 11:
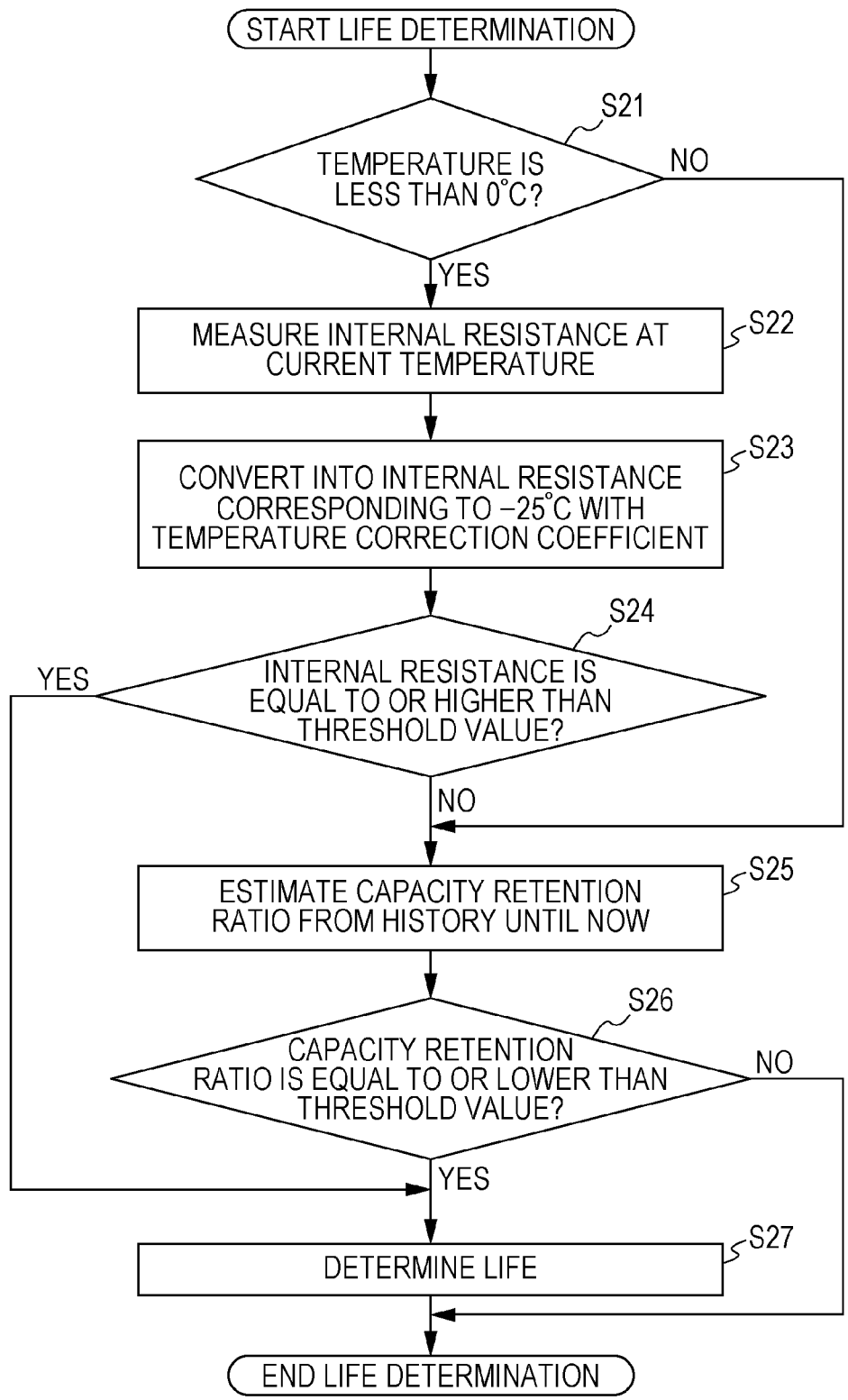
FIG. 11 is a flowchart illustrating a deterioration determination process according to a second embodiment.

A second embodiment will be described with reference to FIG. 11. In the second embodiment, whether a battery has deteriorated or not is determined based on not only the internal resistance R but also the capacity retention ratio CR, when the temperature detected by the temperature sensor 13 is less than a predetermined temperature. The others are similar to the first embodiment, and the description for the similar configurations will not be repeated.

A CPU receives detection signals from a voltage sensor 11, a current sensor 12, and a temperature sensor 13, and determines whether or not the temperature detected by the temperature sensor 13 is less than 0° C. (S21) as illustrated in FIG. 11.

When the temperature detected by the temperature sensor 13 is less than 0° C. ("YES" in S21), the internal resistance R at the current temperature is calculated based on the voltage and the current detected by the voltage sensor 11 and the current sensor 12 (S22). A temperature correction coefficient is multiplied to the internal resistance R obtained by an internal resistance calculation unit at a correction unit 16, whereby the internal resistance R is converted into an internal resistance RA corresponding to the temperature of −25° C. (S23).

Next, the CPU determines whether or not the internal resistance RA converted to −25° C. is equal to or higher than a life determination threshold value (S24). When the internal resistance RA converted to −25° C. is equal to or higher than the life determination threshold value ("YES" in S24), the CPU determines that the battery comes to the end of its life (S27), and displays information encouraging the user to replace the battery on a display unit 24. Then, the CPU ends the life determination.

On the other hand, when the internal resistance RA converted to −25° C. is equal to or lower than the life determination threshold value ("NO" in S24), the CPU reads the history until now from the history data storage unit 18, and subtracts a value according to a temperature or a charge-discharge current to estimate a capacity retention ratio CR (S25). The CPU determines whether or not the capacity retention ratio CR is equal to or lower than the threshold value (S26). When the capacity retention ratio CR is equal to or lower than the threshold value ("YES" in S26), the CPU determines that the battery comes to the end of its life (S27), and displays information encouraging the user to replace the battery on the display unit 24. Then, the CPU ends the life determination. When the capacity retention ratio CR is larger than the life determination threshold value ("NO" in S26), the battery does not yet come to the end of its life. Therefore, the CPU ends the life determination without determining that the battery comes to the end of its life.

When the temperature detected by the temperature sensor 13 is equal to or higher than 0° C. ("NO" in S21), the CPU reads the history until now from the history data storage unit 18, and subtracts a value according to a temperature or a charge-discharge current to estimate a capacity retention ratio CR (S25). The CPU determines whether or not the capacity retention ratio CR is equal to or lower than the threshold value (S26). When the capacity retention ratio CR is equal to or lower than the threshold value ("YES" in S26), the CPU determines that the battery comes to the end of its life (S27), and displays information encouraging the user to replace the battery on the display unit 24. Then, the CPU ends the life determination. When the capacity retention ratio CR is larger than the life determination threshold value ("NO" in S26), the battery does not yet come to the end of its life. Therefore, the CPU ends the life determination without determining that the battery comes to the end of its life.

In the second embodiment, the threshold value of the capacity retention ratio CR at the time when the temperature is equal to or higher than 0° C. may be different from the threshold value of the capacity retention ratio CR at the time when the temperature is less than 0° C. Further, the threshold values of the internal resistance R and the capacity retention ratio CR in the second embodiment may be different from the threshold values of the internal resistance R and the capacity retention ratio CR in the first embodiment.

According to the second embodiment, the determination unit 20 performs a process of determining whether the battery has deteriorated or not based on the internal resistance R and the capacity retention ratio CR, when the temperature detected by the temperature sensor 13 (temperature detection unit) is less than the predetermined temperature.

With this configuration, the deterioration determination is performed based on the capacity retention ratio CR as well as the internal resistance R, when the detected temperature is less than the predetermined temperature. Therefore, even if the battery is not determined to deteriorate based on the internal resistance R upon a low temperature, the deterioration determination of the battery can be performed based on the capacity retention ratio. Accordingly, precision of the deterioration determination can be enhanced. In addition, the life determination can properly be performed by appropriately setting threshold values of the internal resistance R and the capacity retention ratio CR or algorithms for the deterioration determination.

<Third Embodiment>

Figure 12:
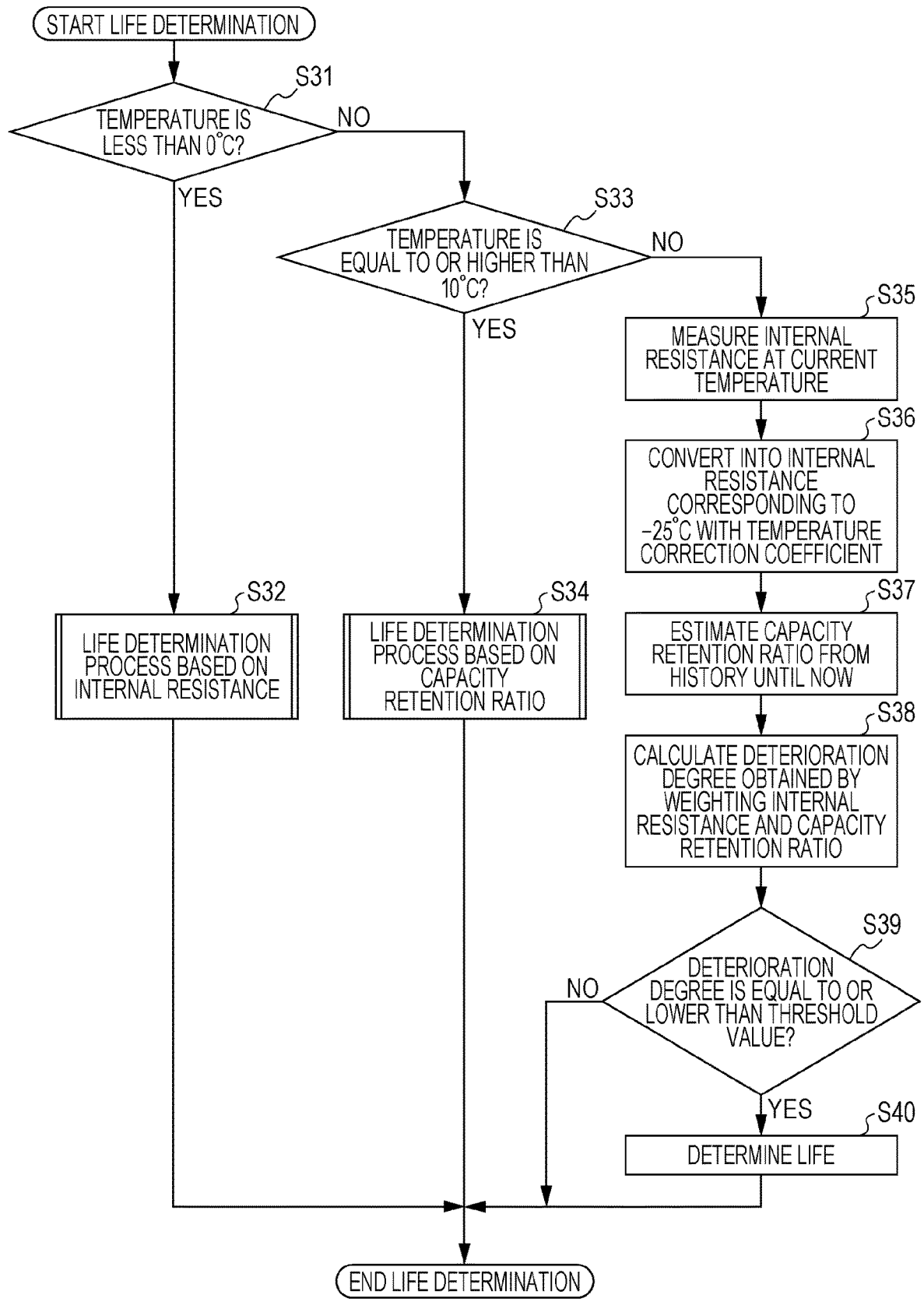
FIG. 12 is a flowchart illustrating a deterioration determination process according to a third embodiment.

A third embodiment will next be described with reference to FIG. 12. In the third embodiment, whether a battery has deteriorated or not is determined by using a deterioration degree obtained by weighting both the internal resistance RA and the capacity retention ratio CR within a predetermined temperature range (in the present embodiment, 0° C. to 10° C.). The description for the configurations similar to the above embodiments will not be repeated below.

The equation (1) described below is used for a deterioration degree of a battery, wherein WA is a weight coefficient of the internal resistance RA and WB is a weight coefficient of the capacity retention ratio CR.

$$\text{Deterioration degree} = (\text{Internal resistance } RA \times WA) + (\text{Capacity retention ratio } CR \times WB) \qquad (1)$$

A different value is set for each of the weight coefficients WA and WB depending upon a temperature. For example, when the battery temperature is 8° C., it can be set as WA=0.2 and WB=0.8. Each of the weight coefficients WA and WB may linearly or non-linearly be increased or decreased according to a temperature. A plurality of weight coefficients WA and WB may be stored in association with a plurality of temperatures, for example.

The process of the deterioration determination device 10 will be described.

A CPU receives detection signals from a voltage sensor 11, a current sensor 12, and a temperature sensor 13, and determines whether or not the temperature detected by the temperature sensor 13 is less than 0° C. (S31) as illustrated in FIG. 12. When the temperature detected by the temperature sensor 13 upon the last cranking is less than 0° C. ("YES" in S31), the CPU performs a life determination process based on the internal resistance R (S32). Specifically, the internal resistance R at the current temperature is measured based on the voltage change and the current change, and this internal resistance R is converted into an internal resistance RA corresponding to −25° C. When the internal resistance RA is equal to or higher than a life determination threshold value, the CPU determines that the battery comes to the end of its life, and displays information encouraging a user to replace the battery on the display unit 24.

When the temperature detected by the temperature sensor 13 is equal to or higher than 10° C. ("NO" in S31 and "YES" in S33), the CPU performs a life determination process based on the capacity retention ratio CR (S34). Specifically, the history until now is read from the history data storage unit 18, and a value according to a temperature or a charge-discharge current is subtracted to estimate the capacity retention ratio CR. When the capacity retention ratio CR is equal to or lower than a threshold value, the CPU determines that the battery comes to the end of its life, and displays information encouraging a user to replace the battery on the display unit 24.

When the temperature detected by the temperature sensor 13 is equal to or higher than 0° C. and less than 10° C. ("NO" in S31 and "NO" in S33), the internal resistance R at the current temperature is measured based on the voltage change and the current change (S35), and this internal resistance is converted into an internal resistance RA corresponding to −25° C. (S36). The CPU also reads the history until now from the history data storage unit 18, and subtracts a value according to a temperature or a charge-discharge current to estimate a capacity retention ratio CR (S37).

The CPU calculates a value (deterioration degree) obtained by weighting the internal resistance RA and the capacity retention ratio CR with the weight coefficients WA and WB (S38) based on the temperature. When the value obtained through the calculation is equal to or lower than a predetermined threshold value for determining the life ("YES" in S39), the CPU determines that the battery comes to the end of its life (S40), and displays information encouraging the user to replace the battery on the display unit 24. Then, the CPU ends the life determination. On the other hand, when the value is equal to or higher than the predetermined threshold value, the CPU ends the life determination without performing any process ("NO" in S39).

According to the third embodiment, whether a battery has deteriorated or not can properly be determined in the case where whether the battery has deteriorated or not cannot properly be determined only based on an internal resistance or a capacity retention ratio within a predetermined temperature range.

<Fourth Embodiment>

In the fourth embodiment, when a temperature of a battery upon an engine start or an engine stop is less than a predetermined temperature (e.g., 0° C.), whether the battery has deteriorated or not is determined based on an internal resistance R, not on a capacity retention ratio CR, when the temperature of the battery later becomes equal to or higher than the predetermined temperature. The others are similar to the above embodiments, and the description for the similar configurations will not be repeated.

A temperature sensor 13 detects a temperature at specified intervals, for example. When the temperature of the battery is less than a predetermined temperature (e.g., 0° C.) upon an engine start or an engine stop (e.g., during parking), a determination unit 20 determines whether the battery has deteriorated or not based on the internal resistance R even when the battery temperature later becomes equal to or higher than the predetermined temperature.

It may be set such that the battery temperature becomes equal to or higher than the predetermined temperature after warm-up of a vehicle is finished after an engine start, and the deterioration determination of the battery may be performed based on the internal resistance R after the warm-up of the vehicle is finished.

<Fifth Embodiment>

In the fifth embodiment, when a temperature becomes less than a predetermined temperature (e.g., 0° C.) from a temperature equal to or higher than the predetermined temperature, the determination unit 20 performs deterioration determination by adding an additional value according to a use state of the battery to the last detected internal resistance R. The others are similar to the above embodiments, and the description for the similar configurations will not be repeated.

For example, there may be the case in which a life is calculated based on the capacity retention ratio CR during the period in which the vehicle is parked for a long time in a season always having an ambient temperature of not less than 0° C., but later, the life calculation condition is changed to the condition based on the internal resistance R (less than 0° C.) during the period in which the vehicle is parked for a long time, because of the change of the season. In such case, when deterioration determination of the battery is performed after the vehicle is started (after a power supply is turned on) and before an engine start (before cranking), an additional value according to a use state of the battery is added to the last calculated internal resistance R to calculate the life. In the present embodiment, the additional value according to the use state of the battery is a numerical value according to time degradation depending on a temperature and time and a charge-discharge history. Not a numerical value according to both time degradation and charge-discharge history but a numerical value according to one (at least one) of time degradation and charge-discharge history may be used as an additional value.

<Sixth Embodiment>

In a sixth embodiment, a determination unit 20 executes an idling stop execution determination for determining whether or not an idling stop is executed or an idling stop time determination for calculating the idling stop time according to a deterioration degree of a battery.

When determining that the battery has deteriorated, the determination unit 20 determines that an idling stop for stopping the engine while the vehicle stops is not performed. The determination unit 20 also calculates a time in which an idling stop is possible according to the deterioration degree of the battery, and sets the calculated time in which the idling stop is possible as an idling stop time.

When determining that the battery comes to the end of its life (the battery has deteriorated), the determination unit 20 may determine that a charge-discharge control is not performed, and when determining that the battery does not come to the end of its life (the battery does not deteriorate), the determination unit 20 may determine that the charge-discharge control is performed. Specifically, the determination unit 20 may determine whether the charge-discharge control has to be changed or not.

Regenerative power is inputted to the battery. When determining that the battery comes to the end of its life (the battery has deteriorated), the determination unit 20 may determine not to receive regenerative power, and when determining that the battery does not come to the end of its life (the battery does not deteriorate), the determination unit 20 may determine to receive regenerative power. Specifically, the determination unit 20 may determine a condition for receiving regenerative power.

<Other Embodiments>

The present invention is not limited to the embodiments described with reference to the above description and drawings, and the following embodiments are included in the technical scope of the present invention.

(1) In the above embodiments, which one of the determination based on the internal resistance R and the determination based on the capacity retention ratio CR, which are different from each other, is executed is determined with the predetermined temperature of 0° C. being specified as a reference. However, which one of the determination based on the internal resistance R and the determination based on the capacity retention ratio CR, which are different from each other, is executed may be made using temperatures other than 0° C.

(2) The internal resistance R is obtained from the current change due to cranking of a vehicle upon discharging and the voltage drop at this time. However, it is not limited thereto. For example, a current change and a voltage change upon regenerative charging at the time when the vehicle decelerates may be used. A temperature correction coefficient obtained beforehand is multiplied to the internal resistance R, and the resultant internal resistance R is used for the deterioration determination. However, it is not limited thereto. For example, the temperature correction coefficient may not be used, and a deterioration determination reference according to an internal resistance value at each temperature may be set.

(3) The assembled battery is a lithium ion storage battery. However, the assembled battery may be other batteries (e.g., lead-acid batteries, nickel cadmium storage batteries, or nickel hydrogen storage batteries).

(4) The internal resistance R and the capacity retention ratio CR may be calculated not only upon the deterioration determination of the battery but also may be calculated independent of the deterioration determination (not depending on a temperature).

What is claimed is:

1. A battery deterioration determination device, comprising:
    a temperature detector configured to detect a temperature of a battery;
    a processor configured to determine whether the battery has deteriorated or not,
    wherein the processor switches a deterioration determination process between a first case where a current temperature detected by the temperature detector is less than a predetermined temperature and a second case where the current temperature detected by the temperature detector is equal to or higher than the predetermined temperature; and
    an internal resistance detector configured to detect an internal resistance of the battery when driving a starter motor, which is for starting an internal combustion engine, after the current temperature detected by the temperature detector is less than the predetermined temperature.

2. The battery deterioration determination device according to claim 1,
    wherein the processor is configured to calculate a capacity retention ratio that is a capacity ratio relative to an initial capacity of the battery,
    wherein the processor executes, as the deterioration determination process, at least one of a first determination process and a second determination process, wherein the first determination process for performing the determination based on the internal resistance detected by the internal resistance detector, when the current temperature detected by the temperature detector is less than the predetermined temperature, and wherein the second determination process for performing the determination based on the capacity retention ratio calculated by the processor, when the current temperature detected by the temperature detector is equal to or higher than the predetermined temperature.

3. The battery deterioration determination device according to claim 2, wherein the processor determines whether the battery has deteriorated or not based on a value obtained by correcting the internal resistance detected by the internal resistance detector to another internal resistance at a reference temperature that is lower than the current temperature upon the detection of the internal resistance.

4. The battery deterioration determination device according to claim 2, wherein the processor performs, when the current temperature detected by the temperature detector is less than the predetermined temperature, the deterioration determination process of determining whether the battery has deteriorated or not based on the internal resistance and the capacity retention ratio.

5. The battery deterioration device according to claim 2, wherein the capacity retention ratio is calculated based on a temperature and a charge-discharge history.

6. The battery deterioration determination device according to claim 2, wherein the processor determines that the battery has deteriorated when the internal resistance or the capacity retention ratio reaches a predetermined life end value, and notifies a need to replace the battery.

7. The battery deterioration determination device according to claim 2, wherein the processor executes both the first determination process and the second determination process within a predetermined temperature range, and determines whether the battery has deteriorated or not by weighting the internal resistance and the capacity retention ratio within the predetermined temperature range.

8. The battery deterioration determination device according to claim 1, wherein the internal resistance is calculated based on a voltage and a current only when a temperature of the battery upon an engine start is less than the predetermined temperature.

9. The battery deterioration determination device according to claim 1, wherein the internal resistance detector determines whether the battery has deteriorated or not based on the internal resistance when a temperature of the battery upon an engine start or an engine stop is less than the predetermined temperature, even if the current temperature of the battery becomes equal to or higher than the predetermined temperature.

10. The battery deterioration determination device according to claim 1, wherein the processor determines whether the battery has deteriorated or not by adding a numerical value according to a use state of the battery to a last detected internal resistance value, when the current temperature becomes less than the predetermined temperature from the temperature equal to or higher than the predetermined temperature.

11. The battery deterioration determination device according to claim 1, wherein the battery deterioration determination device executes an idling stop execution determination for determining whether or not an idling stop is executed or an idling stop time determination for calculating the idling stop time, according to the determination of the processor.

12. The battery deterioration determination device according to claim 1, wherein regenerative power is inputted to the battery, and the processor determines a condition for receiving regenerative power according to deterioration of the battery.

13. The battery deterioration determination device according to claim 1, wherein the processor determines whether the battery has to be replaced or not according to deterioration of the battery.

14. The battery deterioration determination device according to claim 1, wherein the processor determines whether a charge-discharge control has to be changed or not according to deterioration of the battery.

15. The battery deterioration determination device according to claim 1, wherein the predetermined temperature is 0° C.

16. A battery deterioration determination method, comprising:

detecting a temperature of a battery by a temperature detector;

switching a deterioration determination process between a first case where a current battery temperature is less than a predetermined temperature and a second case where the current battery temperature is equal to or higher than the predetermined temperature; and detecting an internal resistance of the battery when driving a starter motor, which is for starting an internal combustion engine, by an internal resistance detector, after the current temperature detected by the temperature detector is less than the predetermined temperature.

17. The battery deterioration determination method according to claim 16, wherein the battery comprises a battery for starting an engine.

18. The battery deterioration determination method according to claim 16, wherein the battery is mounted to a four-wheel automobile.

19. The battery deterioration determination method according to claim 16, wherein the battery comprises a lithium ion storage battery.

20. The battery deterioration determination method according to claim 19, further comprising:

calculating a capacity retention ratio that is a capacity ratio relative to an initial capacity of the battery by the processor, wherein the method executes, as the deterioration determination process, at least one of a first determination process and a second determination process, wherein the first determination process is for performing the determination based on the internal resistance detected by the internal resistance detector, when the current battery temperature detected by the temperature detector is less than the predetermined temperature, and wherein the second determination process is for performing the determination based on the capacity retention ratio calculated by the processor, when the current battery temperature detected by the temperature detector is equal to or higher than the predetermined temperature.

21. An assembled battery, comprising:

a plurality of lithium ion battery cells; and a battery deterioration determination device, wherein the battery deterioration determination device comprises:

a temperature detector configured to detect a temperature of a battery;

a processor configured to determine whether the battery has deteriorated or not, wherein the processor switches a deterioration determination process between a first case where a current temperature detected by the temperature detector is less than a predetermined temperature and a second case where the current temperature detected by the temperature detector is equal to or higher than the predetermined temperature; and an internal resistance detector configured to detect an internal resistance of the battery when driving a starter motor, which is for starting an internal combustion engine, after the current temperature detected by the temperature detector is less than the predetermined temperature.

22. The assembled battery according to claim 21, wherein the processor is configured to calculate a capacity retention ratio that is a capacity ratio relative to an initial capacity of the battery, wherein the processor executes, as the deterioration determination process, at least one of a first determination process and a second determination process, wherein the first determination process for performing the determination is based on the internal resistance detected by the internal resistance detector, when the current temperature detected by the temperature detector is less than the predetermined temperature, and wherein the second determination process is for performing the determination based on capacity retention ratio detected by the processor, when the current temperature detected by the temperature detector is equal to or higher than the predetermined temperature.

* * * * *